(12) United States Patent
Yao

(10) Patent No.: US 8,455,882 B2
(45) Date of Patent: Jun. 4, 2013

(54) HIGH EFFICIENCY LEDS

(75) Inventor: Zhimin Jamie Yao, Santa Barbara, CA (US)

(73) Assignee: Cree, Inc., Durham, NC (US)

( * ) Notice: Subject to any disclaimer, the term of this patent is extended or adjusted under 35 U.S.C. 154(b) by 8 days.

(21) Appl. No.: 13/250,289

(22) Filed: Sep. 30, 2011

(65) Prior Publication Data

US 2012/0256200 A1 Oct. 11, 2012

Related U.S. Application Data

(63) Continuation-in-part of application No. 12/905,995, filed on Oct. 15, 2010.

(51) Int. Cl.
*H01L 21/02* (2006.01)

(52) U.S. Cl.
USPC .......... 257/76; 257/89; 257/99; 257/E33.023; 257/E33.057; 257/E33.072

(58) Field of Classification Search
USPC .............................. 257/76–99, E33.023, 57–73
See application file for complete search history.

(56) References Cited

U.S. PATENT DOCUMENTS

| | | | |
|---|---|---|---|
| 3,760,237 A | 9/1973 | Jaffe | 257/98 |
| 4,511,425 A | 4/1985 | Boyd | 156/493 |
| 4,946,547 A | 8/1990 | Palmour et al. | |
| 5,130,761 A | 7/1992 | Tanaka | 357/17 |
| 5,200,022 A | 4/1993 | Kong et al. | |
| RE34,861 E | 2/1995 | Davis et al. | |
| 5,790,298 A | 8/1998 | Tonar | 359/267 |
| 5,813,753 A | 9/1998 | Vriens et al. | 362/293 |
| 5,959,316 A | 9/1999 | Lowery | 257/98 |
| 6,061,160 A | 5/2000 | Maruyama | 359/152 |
| 6,183,100 B1 | 2/2001 | Suckow et al. | 362/35 |
| 6,259,608 B1 | 7/2001 | Berardinelli et al. | |
| 6,296,367 B1 | 10/2001 | Parsons et al. | 362/183 |
| 6,359,236 B1 | 3/2002 | DiStefano et al. | |
| 6,375,340 B1 | 4/2002 | Biebl et al. | |
| 6,376,902 B1 | 4/2002 | Arndt | 257/678 |
| 6,395,572 B1 | 5/2002 | Tsutsui et al. | 438/46 |
| 6,454,437 B1 | 9/2002 | Kelly | 362/246 |
| 6,480,389 B1 | 11/2002 | Shie et al. | |
| 6,486,499 B1 | 11/2002 | Krames et al. | 257/81 |

(Continued)

FOREIGN PATENT DOCUMENTS

| | | |
|---|---|---|
| CN | 2498694 | 7/2002 |
| CN | 2646873 | 10/2004 |

(Continued)

OTHER PUBLICATIONS

Office Action from U.S. Appl. No. 12/329,713, dated: Oct. 15, 2012.

(Continued)

*Primary Examiner* — Michael Lebentritt
(74) *Attorney, Agent, or Firm* — Koppel, Patrick, Heybl & Philpott

(57) ABSTRACT

A light emitting device and method of fabricating the same is disclosed that comprises at least one light emitter comprising an active region which emits light. The device further comprising a submount arranged such that the at least one light emitter is mounted to the submount such that the active region is angled in relation to the submount.

87 Claims, 4 Drawing Sheets

U.S. PATENT DOCUMENTS

| Patent No. | | Date | Inventor | Ref |
|---|---|---|---|---|
| 6,489,637 | B1 | 12/2002 | Sakamoto et al. | |
| 6,547,249 | B2 | 4/2003 | Collins et al. | |
| 6,642,652 | B2 | 11/2003 | Collins et al. | 313/512 |
| 6,657,236 | B1 | 12/2003 | Thibeault et al. | |
| 6,707,069 | B2 | 3/2004 | Song et al. | 257/79 |
| 6,710,373 | B2 | 3/2004 | Wang | |
| 6,770,498 | B2 | 8/2004 | Hsu | 438/26 |
| 6,791,259 | B1 | 9/2004 | Stokes et al. | |
| 6,828,596 | B2 | 12/2004 | Steigerwald et al. | 257/99 |
| 6,869,812 | B1 | 3/2005 | Liu | |
| 6,946,309 | B2 | 9/2005 | Camras et al. | 438/26 |
| 6,972,438 | B2 | 12/2005 | Li et al. | 257/98 |
| 6,995,510 | B2 | 2/2006 | Murakami et al. | |
| 7,021,797 | B2 | 4/2006 | Minano et al. | 362/355 |
| 7,070,300 | B2* | 7/2006 | Harbers et al. | 362/231 |
| 7,119,422 | B2 | 10/2006 | Chin | 257/666 |
| 7,154,125 | B2 | 12/2006 | Koide et al. | 257/95 |
| 7,196,354 | B1* | 3/2007 | Erchak et al. | 257/79 |
| 7,224,000 | B2 | 5/2007 | Aanegola et al. | 257/98 |
| 7,285,802 | B2 | 10/2007 | Ouderkirk et al. | 257/98 |
| 7,335,920 | B2 | 2/2008 | Denbaars et al. | |
| 7,348,212 | B2 | 3/2008 | Schiaffino et al. | 438/106 |
| D572,210 | S | 7/2008 | Lee | D13/180 |
| D572,670 | S | 7/2008 | Ono et al. | D13/180 |
| D576,574 | S | 9/2008 | Kobayakawa | D13/180 |
| 7,518,158 | B2 | 4/2009 | Keller et al. | 257/98 |
| 7,622,742 | B2 | 11/2009 | Kim et al. | 257/79 |
| 7,683,377 | B2 | 3/2010 | Nagai | 257/79 |
| 7,709,282 | B2 | 5/2010 | Fukshima et al. | 438/26 |
| 7,714,342 | B2 | 5/2010 | Lee et al. | 257/98 |
| 7,781,791 | B2 | 8/2010 | Sakai et al. | 257/98 |
| 7,804,147 | B2* | 9/2010 | Tarsa et al. | 257/433 |
| 7,821,023 | B2 | 10/2010 | Yuan et al. | 257/98 |
| 7,858,408 | B2* | 12/2010 | Mueller et al. | 438/27 |
| 7,915,629 | B2* | 3/2011 | Li et al. | 257/98 |
| 7,985,970 | B2 | 7/2011 | Ibbetson et al. | |
| 8,193,544 | B2* | 6/2012 | Donofrio | 257/88 |
| 8,324,633 | B2* | 12/2012 | McKenzie et al. | 257/79 |
| 2002/0061174 | A1 | 5/2002 | Hurt et al. | |
| 2002/0139987 | A1 | 10/2002 | Collins | |
| 2002/0180351 | A1 | 12/2002 | McNulty | |
| 2003/0116769 | A1 | 6/2003 | Song et al. | |
| 2003/0183852 | A1 | 10/2003 | Takenaka | |
| 2004/0016936 | A1 | 1/2004 | Tanaka et al. | |
| 2004/0041222 | A1 | 3/2004 | Loh | |
| 2004/0047151 | A1 | 3/2004 | Bogner et al. | |
| 2004/0079957 | A1 | 4/2004 | Andrews et al. | |
| 2004/0080939 | A1 | 4/2004 | Braddell et al. | |
| 2004/0126913 | A1 | 7/2004 | Loh | |
| 2004/0217364 | A1 | 11/2004 | Tarsa et al. | |
| 2004/0227149 | A1 | 11/2004 | Ibbetson | |
| 2005/0072981 | A1 | 4/2005 | Suenaga | |
| 2005/0077535 | A1 | 4/2005 | Li | |
| 2005/0082562 | A1 | 4/2005 | Ou et al. | |
| 2005/0117320 | A1 | 6/2005 | Leu et al. | |
| 2005/0135105 | A1 | 6/2005 | Teixeira et al. | |
| 2005/0139252 | A1 | 6/2005 | Shim | |
| 2005/0152127 | A1 | 7/2005 | Kamiya et al. | |
| 2005/0179376 | A1 | 8/2005 | Fung et al. | |
| 2005/0211989 | A1 | 9/2005 | Horio et al. | |
| 2005/0224821 | A1 | 10/2005 | Sakano | |
| 2006/0049477 | A1 | 3/2006 | Arndt | |
| 2006/0060874 | A1 | 3/2006 | Edmond et al. | |
| 2006/0063289 | A1 | 3/2006 | Negley | |
| 2006/0081869 | A1 | 4/2006 | Lu et al. | 257/99 |
| 2006/0102917 | A1 | 5/2006 | Oyama et al. | |
| 2006/0108594 | A1 | 5/2006 | Iwasaki et al. | |
| 2006/0138435 | A1* | 6/2006 | Tarsa et al. | 257/89 |
| 2006/0220046 | A1 | 10/2006 | Yu et al. | |
| 2006/0273335 | A1 | 12/2006 | Asahara | |
| 2007/0018182 | A1 | 1/2007 | Beeson et al. | |
| 2007/0018184 | A1 | 1/2007 | Beeson et al. | |
| 2007/0109779 | A1 | 5/2007 | Sekiguchi | |
| 2007/0145392 | A1 | 6/2007 | Haberem | |
| 2007/0202624 | A1 | 8/2007 | Yoon et al. | 438/29 |
| 2007/0262338 | A1 | 11/2007 | Higashi et al. | 257/99 |
| 2007/0269586 | A1 | 11/2007 | Leatherdale | |
| 2008/0074032 | A1 | 3/2008 | Yano et al. | |
| 2008/0142817 | A1* | 6/2008 | Ibbetson et al. | 257/88 |
| 2008/0157115 | A1 | 7/2008 | Chuang et al. | 257/99 |
| 2008/0179602 | A1 | 7/2008 | Negley et al. | |
| 2008/0211416 | A1 | 9/2008 | Negley et al. | |
| 2008/0217635 | A1 | 9/2008 | Emerson | |
| 2008/0308825 | A1 | 12/2008 | Chakraborty et al. | |
| 2009/0008654 | A1 | 1/2009 | Nagai | |
| 2009/0050907 | A1 | 2/2009 | Yuan et al. | 257/88 |
| 2009/0050908 | A1 | 2/2009 | Yuan et al. | 257/88 |
| 2009/0050911 | A1 | 2/2009 | Chakraborty et al. | |
| 2009/0057699 | A1* | 3/2009 | Basin et al. | 257/98 |
| 2009/0072251 | A1 | 3/2009 | Chan et al. | |
| 2009/0096386 | A1 | 4/2009 | Yeh et al. | |
| 2009/0109151 | A1 | 4/2009 | Kim et al. | |
| 2009/0121241 | A1 | 5/2009 | Keller et al. | |
| 2009/0129085 | A1 | 5/2009 | Aizar et al. | |
| 2009/0261356 | A1 | 10/2009 | Lee et al. | 257/88 |
| 2009/0267085 | A1 | 10/2009 | Lee et al. | |
| 2009/0283781 | A1 | 11/2009 | Chan et al. | |
| 2009/0283787 | A1 | 11/2009 | Donofrio et al. | |
| 2010/0059733 | A1 | 3/2010 | Shei et al. | |
| 2010/0155746 | A1 | 6/2010 | Ibbetson et al. | 257/88 |
| 2010/0252840 | A1 | 10/2010 | Ibbetson et al. | 257/88 |
| 2011/0001149 | A1 | 1/2011 | Chan et al. | |
| 2011/0084294 | A1* | 4/2011 | Yao | 257/93 |
| 2011/0095326 | A1* | 4/2011 | Hsieh | 257/98 |
| 2011/0227102 | A1 | 9/2011 | Hussell et al. | |
| 2012/0032220 | A1* | 2/2012 | Cannon et al. | 257/98 |
| 2012/0049214 | A1* | 3/2012 | Lowes et al. | 257/89 |
| 2012/0097996 | A1* | 4/2012 | Lee et al. | 257/88 |
| 2012/0115268 | A1* | 5/2012 | Yun | 438/47 |
| 2012/0175669 | A1* | 7/2012 | Joichi et al. | 257/99 |
| 2012/0181565 | A1* | 7/2012 | David et al. | 257/98 |
| 2012/0241781 | A1* | 9/2012 | Yuan et al. | 257/89 |
| 2012/0326159 | A1* | 12/2012 | Bergmann et al. | 257/76 |

FOREIGN PATENT DOCUMENTS

| | | |
|---|---|---|
| CN | 1581527 A | 2/2005 |
| CN | 1591924 A | 3/2005 |
| CN | 1679168 A | 10/2005 |
| CN | 1744335 A | 3/2006 |
| EP | 1005085 A2 | 5/2000 |
| EP | 1187228 | 3/2002 |
| EP | 1521313 | 4/2005 |
| JP | 03171780 | 7/1991 |
| JP | 06177424 | 6/1994 |
| JP | 8139257 | 5/1996 |
| JP | 2000223752 | 8/2000 |
| JP | 2006324331 | 11/2006 |
| JP | 2007273763 | 10/2007 |
| JP | 2007287981 | 11/2007 |
| JP | 2007299905 | 11/2007 |
| KR | 200277135 | 10/2002 |
| WO | WO8300408 | 2/1983 |
| WO | WO0217405 | 2/2002 |
| WO | WO2004044877 | 5/2004 |
| WO | WO2005043627 A1 | 5/2005 |
| WO | WO2005104247 | 11/2005 |
| WO | WO2006054228 A2 | 5/2006 |
| WO | WO2006054228 A3 | 5/2006 |
| WO | WO2007083408 A1 | 7/2007 |
| WO | WO2007141763 | 12/2007 |
| WO | WO2009039805 | 4/2009 |
| WO | WO2009074919 A1 | 6/2009 |

OTHER PUBLICATIONS

Office Action and Search Report for Chinese Patent Application No. 200980149197.2, dated Nov. 15, 2012.

Written Opinion of the International Search Authority for PCT Application No. PCT/US2009/066743 filed Dec. 14, 2009.

International Search Report and Written Opinion for Patent Application No. PCT/US2011/001741, mailed Feb. 14, 2012.

Cree EZ700 and EZ1000 EZBright LED chip data sheets.

Acriche LED data sheet, Seoul Semiconductor, 2007, pp. 1-2. available at www.acriche.com/en/product/prd/acriche.asp.

LAMINA TitanTurbo LED Light Engines data sheet, 2008, pp. 1-14.

U.S. Appl. No. 12/418,816, filed Apr. 2009.

U.S. Appl. No. 11/985,410, filed Nov. 2007.

Office Action from German Patent Application No. 10 2008 029 318.0 dated Oct. 19, 2010.

Extended European Search Report for European Patent Application No. 10185708.4 mailed Dec. 2, 2010.

Office Action for Korean Patent Application No. 10-2005-7020463 mailed Dec. 21, 2010.

International Search Report and Written Opinion for PCT/US2010/024980 mailed Oct. 6, 2010.

Windisch et al. "Impact of Texture-Enhanced Transmission on High-Efficiency Surface-Textured Light-Emitting Diodes", Applied Physics Letters, vol. 79, No. 15, Oct. 2001. pp. 2315-2317.

Schnitzer et al. "30% External Quantum Efficiency From Surface Textured, Thin-Film Light-Emitting Diodes." Applied Physics Letters, Oct. 18, 1993, vol. 63, No. 16, pp. 2174-2176.

Windisch et al. "Light-Extraction Mechanisms in High-Efficiency Surface-Textured Light-Emitting Diodes", IEEE Journal on Selected Topics in Quantum Electronics, vol. 8, No. 2, Mar./Apr. 2002, pp. 248-255.

Streubel, et al. "High Brightness AlGaInP Light-Emitting Diodes", IEEE Journal on Selected Topics in Quantum Electronics, vol. 8. No. 2, Mar./Apr. 2002, pp. 321-332.

Final Office Action from U.S. Appl. No. 12/321,059, mailed Sep. 24, 2010.

Response to Final Office Action, U.S. Appl. No. 12/321,059, filed Nov. 23, 2010.

Office Action from U.S. Appl. No. 12/321,059, mailed Feb. 11, 2011.

Response to Office Action, U.S. Appl. No. 12/321,059, filed Jun. 13, 2011.

Office Action from U.S. Appl. No. 12/329,713, mailed Aug. 3, 2011.

Response to Office Action U.S. Appl. No. 12/329,713, filed Dec. 5, 2011.

Final Office Action from U.S. Appl. No. 12/329,713, mailed Feb. 11, 2011.

Response to Final Office Action, U.S. Appl. No. 12/329,713, filed Jul. 8, 2011.

Office Action from U.S. Appl. No. 12/329,713, mailed Sep. 1, 2010.

Response to Office U.S. Appl. No. 12/329,713, filed Dec. 1, 2010.

Office Action U.S. Appl. No. 12/418,816, mailed Apr. 16, 2010.

Response to Office Action U.S. Appl. No. 12/418,816, filed Aug. 11, 2010.

Office Action from U.S. Appl. No. 12/418,816, mailed Oct. 29, 2010.

Response to Office Action U.S. Appl. No. 12/418,816, filed Feb. 28, 2011.

Office Action from U.S. Appl. No. 12/418,816, mailed Aug. 20, 2010.

Response to Office Action U.S. Appl. No. 12/418,816, filed Oct. 20, 2010.

Office Action from U.S. Appl. No. 12/329,713, mailed Feb. 15, 2012.

Response to Office Action U.S. Appl. No. 12/329,713, filed Aug. 15, 2012.

Office Action from related China Application No. 200710142310.7, dated: Dec. 11, 2009.

T-Clad from Bergquist Co., Chanhassen, MN, product info, pp. 1-3.

International Search Report and Written Opinion from PCT/US2010/001852, mailed Nov. 11, 2010.

Notification of First Office Action in Appl. No. CN 200880009255.7, mailed Sep. 26, 2010.

First Office Action for Chinese Patent Appl. No. 200780019643.9, dated Mar. 29, 2010.

JP 2001 060072A, Abstract, Matsushita Electric Ind. Co Ltd., Mar. 6, 2001.

International Search Report and Written Opinion from counterpart Appl. No. PCT/CN2010/001009, mailed Oct. 21, 2010.

Nichia Corp. White LED Part No. NSPW300BS, Specification for Nichia White LED, Model NSPW300BS., Jan. 14, 2004.

Nicha Corp., White LED Part No. NSPW312BS, Specification for Nichia White LED, Model NSPW312BS. Jan. 14, 2004.

Kim J.K at al. "Strongly Enhanced Phosphor Efficiency in GaInN White Light-Emitting Diodes Using Remote Phosphor Configuration and Diffuse Reflector Cup" Japanese Journal of Applied Physics, Japan Society of Applied Physics, Tokyo, JP, vol. 44, No. 20-23, Jan. 1, 2005 XP-001236966, pp. 649-651.

Appeal Decision in Japanese Design Patent Appl. No. 2009-002857 (Appeal No. 2010-002154) mailed Aug. 20, 2010.

Related U.S. Appl. No. 11/656,759, Wafer Level Phosphor Coating Method and Devices Fabricated Utilizing Method, filed Jan. 22, 2007.

Related U.S. Appl. No. 11/899,790, Wafer Level Phosphor Coating Method and Devices Fabricated Utilizing Method, Filed Sep. 7, 2007.

Related U.S. Appl. No. 11/473,089, "Close Loop Electrophoretic Deposition of Semiconductor Devices", filed Jun. 21, 2006.

From related Application: International Search Report for PCT/CN2009/074800, mailed Feb. 25, 2010.

* cited by examiner

HIGH EFFICIENCY LEDS

This is a continuation in part application from Ser. No. 12/905,995 filed Oct. 15, 2010, entitled "HIGH VOLTAGE WIRE BOND FREE LEDS."

BACKGROUND OF THE INVENTION

1. Field of the Invention

This invention relates to light emitting diode (LED) chips and in particular LED chips having increased efficiency and light extraction.

2. Description of the Related Art

Light emitting diodes (LED or LEDs) are solid state devices that convert electric energy to light and generally comprise an active region of semiconductor material sandwiched between two oppositely doped layers of semiconductor material. When a bias is applied across the doped layers, holes and electrons are injected into the active region where they recombine to generate light. Light is emitted from the active layer and from all surfaces of the LED.

In order to use an LED chip in a circuit or other like arrangements, it is known to enclose an LED chip in a package to provide environmental and/or mechanical protection, color selection, light focusing and the like. An LED package can also include electrical leads, contacts or traces for electrically connecting the LED package to an external circuit. FIG. 1 shows a conventional LED package that generally comprises a single LED chip 12 mounted on a reflective cup 13 by means of a solder bond or conductive epoxy. One or more wire bonds 11 connect the ohmic contacts of the LED chip 12 to leads 15A and/or 15B, which may be attached to or integral with the reflective cup 13. The reflective cup 13 can be filled with an encapsulant material 16 which can contain a wavelength conversion material such as a phosphor. Light emitted by the LED at a first wavelength can be absorbed by the phosphor, which can responsively emit light at a second wavelength. The entire assembly is then encapsulated in a clear protective resin 14, which may be molded in the shape of a lens over the LED chip 12.

FIG. 2 shows another conventional LED package 20 that may be more suited for high power operations that can generate more heat. In the LED package 20, one or more LED chips 22 are mounted onto a carrier such as a printed circuit board (PCB) carrier, any other board, substrate or submount 23. A reflector 24 can be included on the submount 23 that surrounds the LED chip(s) 22 and reflects light emitted by the LED chips 22 away from the package 20. Different reflectors can be used such as metal reflectors, omni-directional reflectors (ODRs), and distributed Bragg reflectors (DBRs). The reflector 24 can also provide mechanical protection to the LED chips 22. One or more wire bond connections 11 are made between ohmic contacts on the LED chips 22 and electrical traces 25A, 25B on the submount 23. The mounted LED chips 22 are then covered with an encapsulant 26, which may provide environmental and mechanical protection to the chips while also acting as a lens. The metal reflector 24 is typically attached to the carrier by means of a solder or epoxy bond. In these embodiments the LED chips are generally mounted such that the top and bottom (on the carrier) surfaces have a larger surface area than the side surfaces. Therefore any light emitted towards the bottom of the LED chip must be reflected up and through the LED chip to exit the chip, resulting in extra reflections of the emitted light. Each extra bounce of light on its way to emission from the LED chip results in about 2% loss of light, when a highly reflective mirror is in use. On average, when LED chips are mounted in this configuration, light experiences 9 bounces before it can exit the LED chip.

LEDs can be fabricated to emit light in various colors. However, conventional LEDs cannot generate white light from their active layers. Light from a blue emitting LED has been converted to white light by surrounding the LED with a yellow phosphor, polymer or dye, with a typical phosphor being cerium-doped yttrium aluminum garnet (Ce:YAG). The surrounding phosphor material "down-converts" the energy of some of the LED's blue light which increases the wavelength of the light, changing its color to yellow. Some of the blue light passes through the phosphor without being converted while a portion of the light is down-converted to yellow. The LED emits both blue and yellow light, which combine to provide a white light. In another approach light from a violet or ultraviolet emitting LED has been converted to white light by surrounding the LED with multicolor phosphors or dyes.

In recent years, there have been dramatic improvements in light emitting diode technology such that LEDs of increased brightness and color fidelity have been introduced. Due to these improved LEDs, lighting modules have become available to further increase luminous flux output. Both single and multi-chip modules have become available, with a single-chip module generally comprising a single package with a single LED. Multi-chip lighting modules typically comprise a single package with a plurality of LEDs. These lighting modules, particularly the multi-chip modules, generally allow for high output of light emission.

However, the emitted light from the device chip(s) may be largely non-directional and non-uniform, which can negatively impact the emission and optical efficiency of a lighting module. Furthermore, traditionally these LEDs are mounted such that the active region is parallel to the mounting surface. Therefore, a mirror must be placed under the active region, or between the active region and the mounting surface to reflect the light emitted towards the mounting surface up and out of the light emitter. Due to emission of the light towards the mirror and total internal reflection, emitted light reflects several times before exiting the light emitter. Generally there is a 2-3% light loss per bounce or reflection. On an average, it takes about 8-9 reflections for photons to exit the LED. This can result in approximately total of 16-27% light loss due to multiple reflections.

Often, a light diffusion lens, light scattering particles, and/or phosphor particles are disposed or deposited over the chip(s) to assist in achieving more uniform light emission. A fraction of brightness can be lost when utilizing such means, largely due to back-emission from the emitter, or scattering and back-reflection of light from a light diffusion lens, light scattering particles, and phosphor particles.

To redirect the back-emitted, scattered and/or back-reflected light, reflective materials have been disposed or deposited on the substrate of various light emitting devices. The reflective materials may be deposited on only portions of the substrate, or may be disposed or deposited as a reflective layer on the substrate. In other attempts to redirect scattered and/or back-reflected light, light-reflective, white printed circuit board (PCB) and/or substrate technology has been developed. The materials used for this existing technology may be epoxy or silicone-based. Epoxy or Silicones may yellow during prolonged use and/or common fabrication steps known in the art, such as reflow soldering. Epoxy materials may also degrade in the presence of blue light.

SUMMARY OF THE INVENTION

The present invention provides various embodiments of semiconductor devices and LED chips that are mounted such that they increase output efficiency. The different embodiments comprise various arrangements having LEDs or sub-LEDs mounted such that a surface with a smaller surface area is adjacent to the submount, or mounted such that the active region is perpendicular to the submount.

One embodiment of an LED chip according to the present invention comprises at least one light emitter comprising an active region which emits light. The embodiment also comprises a submount arranged such that the at least one light emitter is mounted to the submount such that said active region is angled in relation to the submount, and a mounting surface of the light emitter which is angled in relation to a plane of the active region.

One method for fabricating another embodiment of a LED chip according to the present invention comprises providing at least one LED including first and second semiconductor layers and a substrate. Further comprising mounting the at least one LED on a submount such that the submount is at an angle to the first and second semiconductor layers.

Another embodiment of a LED package according to the present invention comprises a LED comprising a first semiconductor material, a second semiconductor material, a substrate, and an active region formed in between the first and second semiconductor materials. Further comprising a submount, wherein the LED is mounted on the submount such that the mounting surface of the LED has a surface area equal to or smaller than the remaining surfaces of the LED. Also comprising an encapsulant disposed over the LED.

Yet another embodiment of a LED package according to the present invention comprises a LED. The package further comprises a submount, wherein the LED is mounted on the submount such that the mounting surface of the LED is along the minor axis of the LED. The package also comprises an encapsulant disposed over or covers the LED.

A better understanding of the features and advantages of the present embodiments will be obtained by reference to the following detailed description of the invention and accompanying drawings which set forth illustrative embodiments in which the principles of the invention are utilized.

BRIEF DESCRIPTION OF THE DRAWINGS

FIG. 5 is a cross-sectional view at line a-a in FIG. 4a;

DETAILED DESCRIPTION OF THE INVENTION

Figure 1:
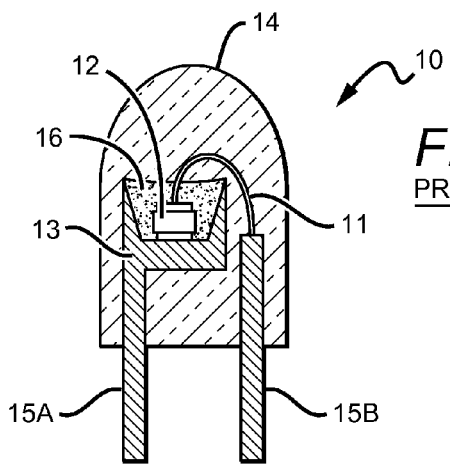
FIG. 1 shows a sectional view of a prior art LED package.
Figure 2:
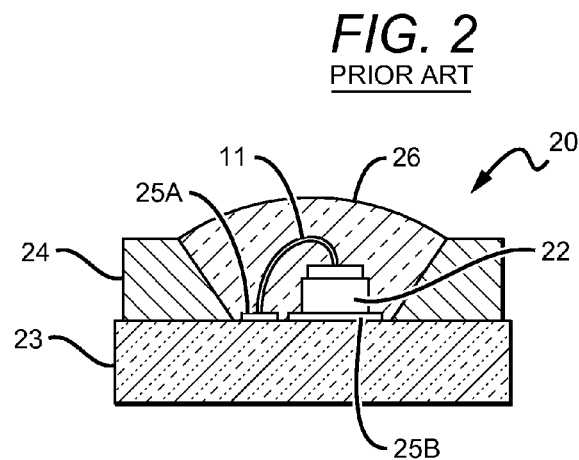
FIG. 2 shows a sectional view of another prior art LED package.

The present invention provides structures and methods for producing light emitting devices and packages for the same, such as single or multi-junction LED devices, that provide high luminous flux output where the LED chips or chips within the packages can be mounted sideways (or other features as described below) to provide better light output. Several possible embodiments of the present invention are generally directed to light emitting devices incorporating LEDs, but it is understood that other light emitting devices, such as lasers, may also be used. Rotating the chips can also allow for a lower loss of light within the LED since less light may be reflected within the LED. Due to total internal reflection, it is estimated, on average, light generated in typical LEDs bounces or reflects about 8-9 times before exiting the LED chip. If 2-3% of light is lost in each reflection, the total loss of light can be about 16-25%, resulting in only about 75-84% of light to be emitted. Arrangements such as those in some embodiments of the present invention may improve light extraction by up to 16%. These arrangements may also decrease the average number of reflections to about 3 times, therefore the total light loss due to reflections is about 6-9%. The light extraction is improved from 82% to 94%. Light extraction here means the percentage of light that leaves a LED chip of the total light generated by the LED chip.

The present invention is described herein with reference to certain embodiments, but it is understood that the invention can be embodied in many different forms and should not be construed as limited to the embodiments set forth herein. In particular, the present invention is described below in regards to mounting single or multiple-junction LEDs in different configurations, but it is understood that the present invention can be used in many other configurations. The LEDs and different components can have different shapes and sizes beyond those shown and different numbers of LEDs can be included in the array. Some or all of the LEDs can be coated with a down-converter coating that can comprise a phosphor loaded binder ("phosphor/binder coating").

It is also understood that when an element such as a layer, region or substrate is referred to as being "on" another element, it can be directly on the other element or intervening elements may also be present. Furthermore, relative terms such as "inner", "outer", "upper", "above", "lower", "beneath", "below", "first", and "second" and similar terms, may be used herein to describe a relationship of one layer or another region. It is understood that these terms are intended to encompass different orientations of the device in addition to the orientation depicted in the figures.

It is noted that the terms "layer" and "layers" are used interchangeably throughout the application. A person of ordinary skill in the art will understand that a single "layer" of semiconductor material may actually comprise several individual layers of material. Likewise, several "layers" of material may be considered functionally as a single layer. In other words, the term "layer" does not denote a homogenous layer of semiconductor material. A single "layer" may contain various dopant concentrations and alloy compositions that are localized in sub-layers. Such sub-layers may function as buffer layers, contact layers or etch-stop layers, for example. These sub-layers may be formed in a single formation step or in multiple steps. Unless specifically stated otherwise, the Applicant does not intend to limit the scope of the invention as embodied in the claims by describing an element as comprising a "layer" or "layers" of material.

Although the terms first, second, etc. may be used herein to describe various elements, components, regions, layers and/ or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional view illustrations that are schematic illustrations of embodiments of the invention. As such, the actual thickness of the layers can be different, and variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the invention. In addition, some of the figures may not show particular details which are known to be understood in the art.

Figure 3:
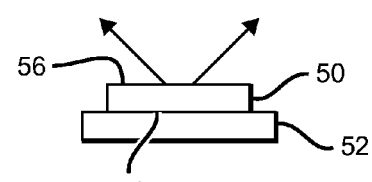
FIG. 3 shows a side view of a prior art LED chip.

The present invention generally provides devices and methods for light emitting devices for increasing light output using mounting to reduce loss of light within LEDs. Traditionally, as shown in FIG. 3, prior art LEDs 50 are mounted on a substrate 52 such that the surface facing the mounting area 54 (submount or other mounting area) and the surface opposite the mounting area 56, generally referred to as the top and bottom, have a surface area larger than the sidewalls of the LED. In other words, the mounting surface would be parallel to the active region or layer or region of the LED. Active regions of LEDs emit light in all directions. In these configurations, light emitted from the active region towards the mounting surface would be partially absorbed and partially reflected by a reflective layer within the LED or on the mounting surface causing a portion of the light to be lost. Due to total internal reflection, portions of the light need to reflect several times before it can find its way out of LED chip. The present invention eliminates the traditional large mirror which reflects light. This invention provides embodiments which allow a larger portion of emitted light to exit LED from both sides of the active region of the LED which are parallel to the active area with fewer numbers of reflections as described above.

Features such as wire bonds, conversion layers, and encapsulants, often referred to as packaging elements, are typically added to LED devices after the device has been mounted in a conventional LED package. Bond wires are lead wires that provide electrical paths from an outside voltage/current source to the internal semiconductor layers, allowing a voltage bias to be applied to the device. In embodiments which have structures and methods disclosed in the claims that obviate the need for wire bonds, packaging elements may be added to the device at the wafer level, i.e., prior to LED being singulated, or mounted and wired bonded in a conventional LED package. These designs provide additional flexibility, permitting customers to specify additional features that may be realized at the wafer level. Also, because the features may be added to the chip at the wafer level rather than at a later packaging level, the cost to produce the chip or LED with package may be reduced.

Different embodiments of monolithic LED chips according to the present invention can also comprise wire-bond-free ("WBF") configurations or interconnects. This can require a number of metallization layers and at least one insulating layer to be placed on at least a portion of a LED chip to create a series or parallel connected sub-LEDs, with the number of interconnects dependant on several factors including the number of sub-LEDs in each connected string. Other embodiments can comprise different combinations of metallization layers, insulation layers, and vias through the insulation layers to provide electrical connections to the light emission layers and outside electrical sources. This allows for a LED chip with a number of sub-LEDs to be provided, with the LED chips having WBF interconnects to connect some or all of the sub-LEDs to achieve the desired operating voltage. This approach can result in more reliable and less fragile high voltage LED chips. These high voltage LED chips can provide higher quantum efficiency and better use of the chip area than non-monolithic or previous high voltage LEDs which sometimes require wire bond pads, because WBF chips may not need N-contact or wire-bond pads and current spreading fingers or a portion of the p-type layer to undergo a p-kill process which damages the active area so no electrons are wasted.

The embodiments according to the present invention differ from the conventional LED chip architecture and technology in a number of ways. The present invention allows for embodiments which allow the LED to emit a larger portion of light from the larger surfaces of the LED which are parallel to the active area plane without using a mirror to reflect light. The present invention can be utilized at the LED chip level to replace LED chips which are mounted in the traditional manner. The present invention can be applied to larger area applications, such as at the wafer level or at portions of the wafer.

The present invention also allows for the use of both single junction LEDs or multi junction LEDs which are comprised of two or many more serially or parallel connected sub-LEDs on a monolithic surface-emitting chip. Each of the sub-LEDs can be electrically isolated from the others (apart from the interconnects), by different combination of electrical conducting and electrically insulating layers and features. In different embodiments this isolation may also require inserting an electrical insulator layer between the junctions and the metallization layers, and creating individual ohmic contacts to each junction. These sub-LEDs may be connected by wire bonds or may be by thin film metallization, such as a WBF embodiment. In some embodiments the LED or sub-LEDs are on a substrate, either the growth substrate, a carrier substrate, or they can be transferred to some other mechanical holder when most of the fabrication is done. All or part of the p-type semiconductor layers, n-type semiconductor layers, buffer layers and all of the quantum well layers are removed to isolate the sub-LEDs from each other.

Though both single and multi-junction LEDs may be used, some advantages of using a multi-junction design include that the process yield (good dies per wafer) may increase due to its inherent defect tolerance because a single shorting junction defect would fail a single junction device, the same shorting defect on one of the junctions in a multi-junction device would fail, in some cases, only an individual junction. The electrical current would pass through the defective junction and although the defective junction would not emit light, the remaining junctions would operate normally. All else being equal, the higher yield allowed by the present invention can reduce the cost of LED lighting on a lumens per dollar basis. Further, compared to the alternative of stringing multiple small LED chips or LED packages in series to achieve high voltage/low current operation at the system level (e.g. a light bulb), a multi junction LED allows for significantly smaller source size by having the emitting junctions closer. This results in a source that more closely resembles a point source, allowing for greater efficiency and flexibility in the design of secondary optics to control the radiation pattern. Another advantage is that by using power to drive the monolithic chip that is closer to the conventional grid power, losses in converting the grid power can be reduced. Multi-junction LEDs may also allow for reduction in the size of the conversion drive circuitry, which in turn reduces the overall size of the emitter package or solid state lighting package.

Figure 5:
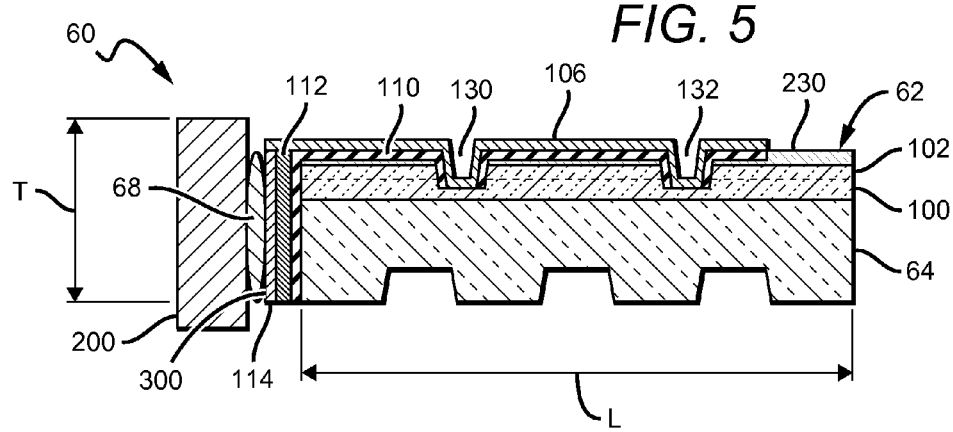
Figure 6:
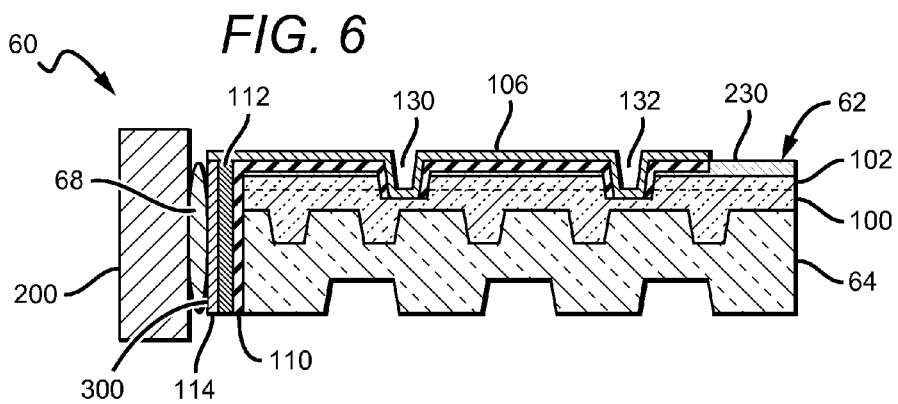
FIG. 6 is a cross-sectional view at line a-a in FIG. 4a of another embodiment according to the present invention.
Figure 7:
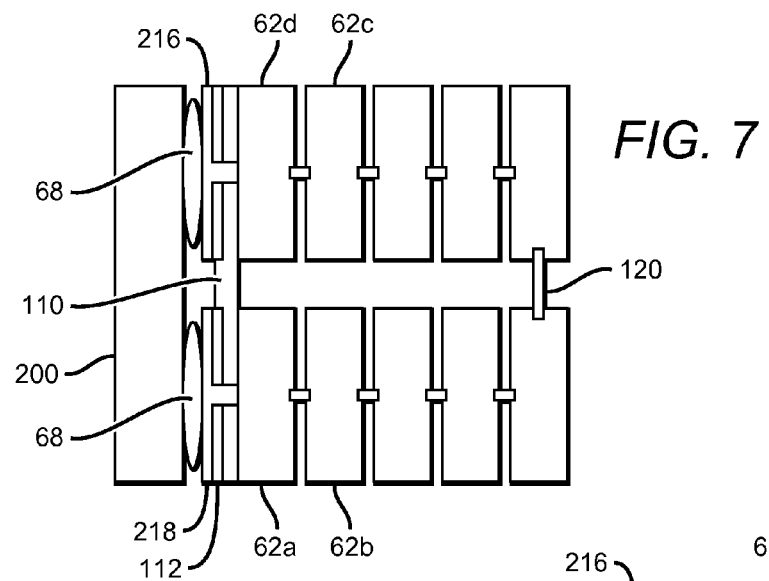
FIG. 7 is a top view of one embodiment of a side mount LED with sub-LEDS according to the present invention.
Figure 8:
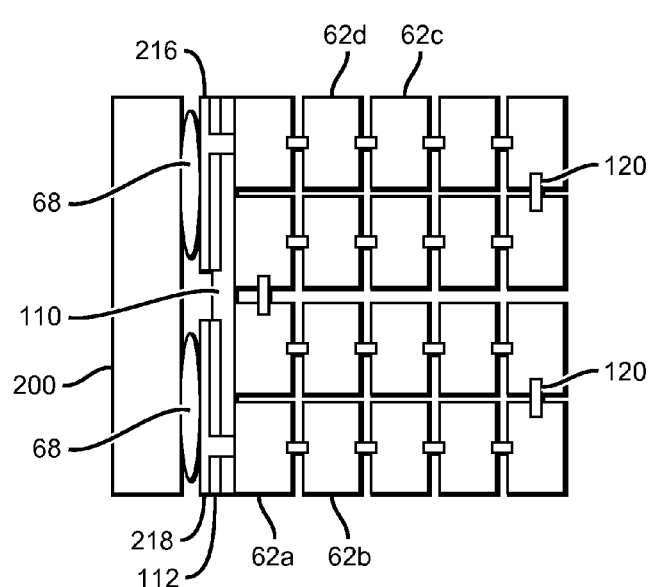
FIG. 8 is a top view of another embodiment of a side mount LED with sub-LEDS according to the present invention.

FIGS. 4a-10 show embodiments according to the present invention of side mounted LED chips, both single junction LEDs (FIGS. 4a-6) and multi-junction LEDs (FIGS. 7-8). These embodiments show an LED or sub-LEDs mounted such that the plane of the active region of the LED or sub-LEDs is not parallel to the mounting surface. The LEDs or sub-LEDs may be mounted such that the plane of the active region is at any angle between 1 and 179 degrees in relation to the mounting surface. These embodiments also show LEDs or sub-LEDs which are mounted such that the mounting surface of the LED or sub-LED's has a smaller surface area than the primary emission surfaces or side surfaces (the side surfaces such that the mounting surface is considered the bottom, the surface opposite this is the top, the remaining surfaces are the side surfaces). Further, these embodiments show LEDs and sub-LEDs which can be directly mounted to a submount or a board without additional carriers. For ease of reference the term submount will be used to refer to both submounts and boards. Any type of light emitting diode can be used in the embodiments.

FIGS. 4a through 6 show one embodiment of a side mounted LED chip 60 according to the present invention comprising an LED mounted on substrate or submount 200. LED 62 is on or includes submount or substrate 64. It is understood that in other embodiments, the substrate 64 can comprise a growth substrate for the LED chip 60 or a submount. It is further understood that in some embodiments this submount may be capable of conducting or dissipating heat. This embodiment is directed to a single junction LED chip with an active area substantially covering the substrate 64. Some of the necessary insulators to prevent shorting of the LED are not shown in this view but are still required for the LED to operate. In some embodiments, the submount 200 has at least two electrodes that are electrically isolated from each other.

Figure 4A:
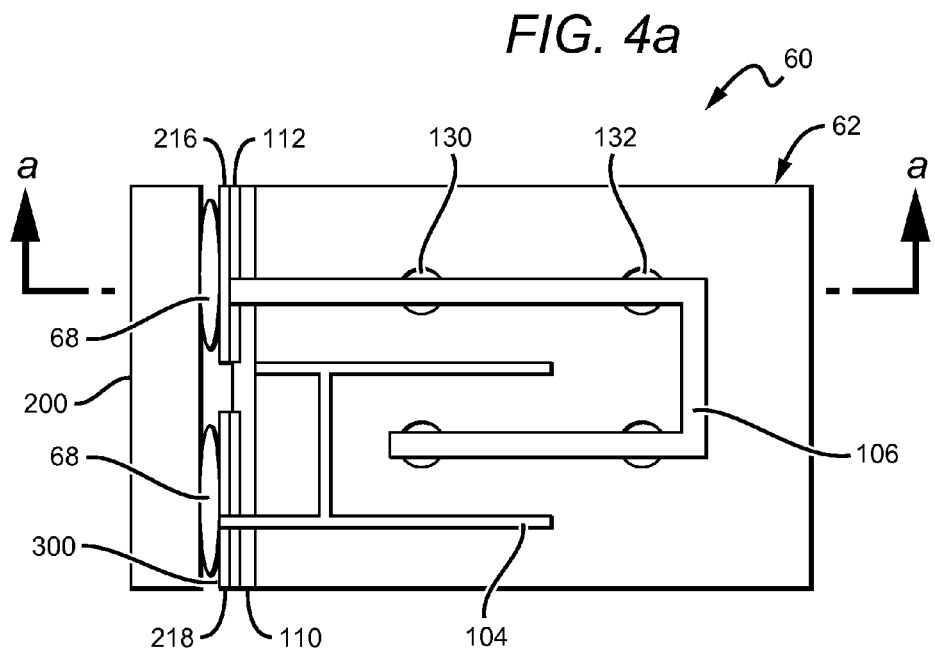
FIG. 4a is a top view of one embodiment of a side mount LED according to the present invention.
Figure 4B:
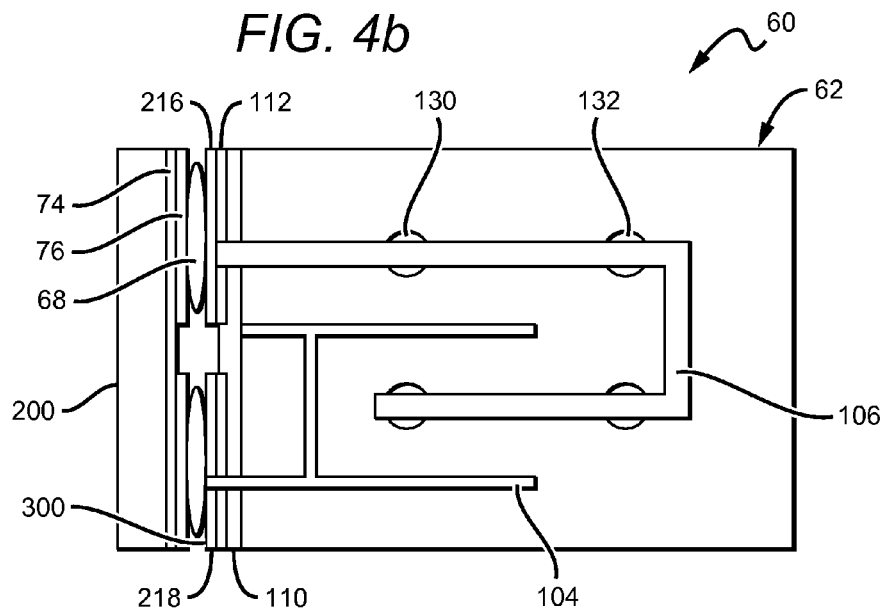
FIG. 4b is a top view of another embodiment of a side mount LED according to the present invention.

FIG. 4b shows another embodiment of the LED chip shown in FIG. 4a. In FIG. 4b the submount 200 includes an insulator 74. An insulator 74 may be required in embodiments where the submount 200 includes a metal core. FIG. 4b also shows submount die attach pads 76. These die attach pads 76 may be metallization layers on the submount which would provide electrical connection to the n-die attach pad 216 and p-die attach pad 218 of LED 62. As shown in FIG. 4b, the different portions of the submount die attach pads 76 associated with each of the n- and p-die attach pads 216, 218, are isolated from one another so as to prevent shorting of the circuit.

FIG. 5 shows a cross-sectional view, taken at line a-a in FIG. 4a, of one embodiment of the LED chip 60. As mentioned above, many more LED layouts can be provided. These are only a few of the many different arrangements that can be provided in the LED chips according to the present invention.

Referring again to FIGS. 4a to 6, each of the LEDs can cover entire substrate 64. Referring to FIGS. 7 and 8, each of the sub-LEDs 62a-d can have similar features and characteristics as a single junction LED that covers the entire substrate 64. In FIGS. 7 and 8 only sub-LEDs 62a-d are specifically marked as examples, however, the figures show more sub-LEDs and other embodiments may have more or less sub-LEDs. Connected sub-LEDs may also be referred to as LED strings. The LEDs 60 and sub-LEDs 62a-d can have many different semiconductor layers arranged in different ways. The fabrication and operation of the layers that comprise LEDs and sub-LEDs 62a-d is generally known in the art and only briefly discussed herein. The epitaxy layers of the LEDs 62 and sub-LEDs 62a-d can be fabricated using known processes with suitable parameters using a process such as metal organic chemical vapor deposition (MOCVD). Other methods such as vapor-phase epitaxy (VPE) or liquid-phase epitaxy (LPE) can also be used to grow semiconductor layers for LEDs. The layers of the LEDs 62 and sub-LEDs 62a-d generally comprise an active layer/region sandwiched between first and second oppositely doped epitaxial layers all of which are formed successively on a growth substrate.

FIGS. 7 and 8 show embodiments which have multi-junction LEDs comprised of sub-LEDs 62a-d. The sub-LEDs may be connected serially or in parallel and by bonded wires or by WBF, such as thin film metallizations and are mounted or grown on substrate 64. This embodiment is directed to a monolithic LED chip 60 that is used instead of a single junction LED chip (e.g. as shown in FIGS. 4a-6) that have an active area substantially covering the substrate 64. The multiple serially connected sub-LEDs 62a-d may be arranged to cover the same surface area or footprint of the single junction LED, except that a certain portion of the active area may be removed to separate the sub-LEDs 62a-d, and to allow for serial connection of the sub-LEDs 62a-d. Although a number of sub-LEDs 62a-d are shown it is understood that many more sub-LEDs can be included depending on different factors such as the desired operating voltage.

It is understood that additional layers and elements can also be included in each of the LEDs 62 and sub-LEDs 62a-d, including but not limited to electron blocking, buffer, nucleation, contact and current spreading layers as well as light extraction layers and elements. It is also understood that the oppositely doped layers can comprise multiple layers and sub-layers, as well as upper lattice structures and inter layers. The active region can comprise single quantum well (SQW), multiple quantum wells (MQW), double heterostructure or super lattice structures. The order of the layers can be different than in the embodiment shown, the first or bottom epitaxial layer can be an n-type doped layer and the second or top epitaxial layer can be a p-type doped layer, although in other embodiments the first layer can be p-type doped and the second layer n-type doped. In different embodiments all or a portion of the growth substrate can be removed. The growth substrate can be removed by several known methods, including wet and dry etching processes or laser ablation. In those embodiments where the growth substrate is removed, the n-type doped layer is exposed or a carrier wafer may replace the growth substrate. In still other embodiments portions of the growth substrate can be left on the LEDs and sub-LEDs 62a-d and in some embodiments can be shaped or textured to enhance light extraction.

The layers of the LED 62 or sub-LEDs 62a-d may be fabricated from different material systems, with preferred material systems being Group-III nitride based material systems. Group-III nitrides refer to those semiconductor compounds formed between nitrogen and the elements in the Group III of the periodic table, usually aluminum (Al), gallium (Ga), and indium (In). The term also refers to ternary and quaternary compounds such as aluminum gallium nitride (Al- GaN) and aluminum indium gallium nitride (AlInGaN). In one embodiment according to the present invention, the n- and p-type layers are gallium nitride (GaN) and the active region is InGaN, but it is understood that these embodiment may include additional layers with different compositions such as AlGaN buffer layers, upper lattice structures with GaN/InGaN layers, and cap layers comprising AlGaN. In alternative embodiments the n- and p-type layers may be AlGaN, aluminum gallium arsenide (AlGaAs) or aluminum gallium indium arsenide phosphide (AlGaInAsP). Different compositions of Group-III nitride material systems can have different junction voltages, such as in the range of 2.5 to 3.5 volts.

The LED or sub-LED growth substrate 64 can be made of many materials such as sapphire, silicon, silicon carbide, aluminum nitride (AlN), GaN, with a suitable substrate being a 4H polytype of silicon carbide, although other silicon carbide polytypes can also be used including 3C, 6H and 15R polytypes. Silicon carbide has certain advantages, such as a closer crystal lattice match to Group III nitrides than sapphire and results in Group III nitride films of higher quality. Silicon carbide also has a very high thermal conductivity so that the total output power of Group-III nitride devices on silicon carbide is not limited by the thermal dissipation of the substrate (as may be the case with some devices formed on sapphire). The substrate 64 which the LED or sub-LED is grown on or mounted to must be a transparent material, such as silicon carbide, sapphire, or any other suitable material, to allow the output of light on either side of the substrate 64. In embodiments with sub-LEDs, it may be necessary to grow a layer of insulating material first on silicon carbide substrate to ensure the sub-LEDs are isolated except where the interconnects are placed. In some embodiments this substrate will be the light emission surface and thus it must be transparent. In some embodiments this substrate will be electrically insulating and function as an insulator. In other embodiments the substrate will be conductive and contacts to the n-type or p-type layer, whichever is adjacent to the substrate, may be placed on the substrate. SiC substrates are available from Cree Research, Inc., of Durham, N.C. and methods for producing them are set forth in the scientific literature as well as in a U.S. Pat. Nos. Re. 34,861; 4,946,547; and 5,200,022.

In one embodiment, as shown in FIG. 5, n-type layer 100, p-type layer 102, quantum wells and other epitaxial layers are fabricated or formed over substrate 64. These n-type 100 and p-type 102 layers may be fabricated from different material systems as described above. For simplicity, not all epitaxial layers are shown in the figures. After all epitaxial layers, including n-type layer 100 and p-type layer 102, are formed or fabricated by methods described above and known in the art, the n-contacts and p-contacts are formed. These are formed by etching a portion of the n-type layers 100, quantum well, and p-type layers 102 to allow placement of the re-contact or p-contact metallization layers 104, 106. In embodiments with sub-LEDs, the quantum well, n-type layers 100 and p-type layers 102 are also etched between the sub-LEDs to separate the sub-LEDs 62a-d. In some embodiments, at least one insulator layer such as 110 is needed to provide isolation between different metallization layers as well as between metallizations and semiconductor layers. Electrical current is applied to the LED, specifically the n-type 100 and p-type 102 layers through metallization layers or traces 104, 106. These metallization layers 104, 106 can be accessed or provided current from the mounting surface 300 of the LED 60 via the n-die attach pad 216 and p-die attach pad 218. The current is passed from p-die attach pad 218 to n-die attach pad 216 through the vias 130, 132 in insulator 110 providing access to the respective n-type 100 and p-type 102 semiconductor layers. In some embodiments the first 216 and second 218 die attach pads may refer to n-die attach pad and p-die attach pad respectively, while in other embodiments it may be the reverse.

Figure 10:
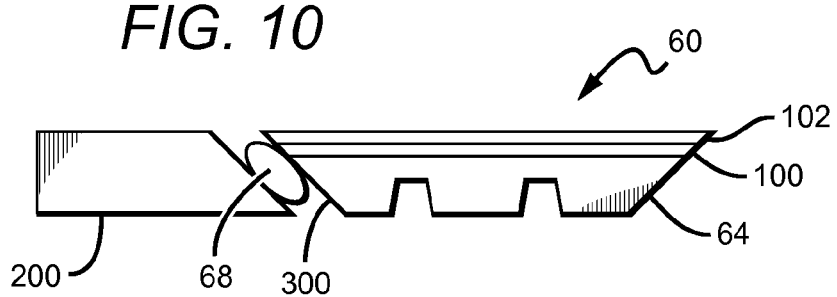
FIG. 10 is a side view of another embodiment of a side mount LED according to the present invention.

In some embodiments, the mounting surface 300 of the LED 60 is created as a sidewall at the wafer level. The mounting surface 300 can be substantially perpendicular to the substrate surface, as shown in FIGS. 4a-8 or it can be angled as shown in FIG. 10. The angle at which mounting surface 300 is in relation to the other surfaces of the LED chip may be any angle other than 90 degrees. An angled mounting surface 300 may be easier to manufacture and provide easier patterning of the side wall. The mounting surface 300 is created by partially or fully cutting, dicing or etching the growth substrate or wafer. Photolithography plus etching or other acceptable methods may be used to open the gap. In other embodiments the mounting surface or sidewall may be created or modified after wafer level processing but this may be more costly. Next, the insulator 110 and metallization layers may be added. An insulator 110 is deposited to isolate the p-layer 102 and n-layer 100 from the other conducting layers on the chip. Photolithography or other patterning methods may be used to define the location of the p-die attach and n-die attach pads. Metallization of the p-die attach pad 218 and n-die attach pad 216 can be achieved by any suitable methods know to art such as sputtering, evaporation or plating, with plating be the preferred method. This metallization layer, forming die attach pads 216, 218, may be applied to only a portion of the mounting surface 300. In some embodiments the metallization layer 216, 218 may be comprised of solder like materials. In other embodiments other suitable metallic materials compatible with solder paste may be used. A reflector or mirror 112 may also be deposited for light extraction. In some embodiments the die attach pads 216, 218 may be placed over the metallization layer or may be a portion of the metallization layer 114. The die attach pads 216, 218 can be used to mount the LED 62 or sub-LEDs 62a-d to a submount 200. In other embodiments, metal bond material or stacks 68 may be used to complete mounting. This bond material may comprise solder paste or solder pre-form. Insulators may be provided to insulate the various parts from others, such as the die attach pads from one another, to prevent shorting and maintain functionality of the LED 60. The LED 62 or sub-LEDS 62a-d is then mounted to the submount or the board 200 at the die attach or metal stacks, using solder materials. In other embodiments, die attach pads 216 and 218 may comprise solder materials. In some embodiments, mirrors or reflective materials may be used on at least a portion of other surfaces, such as the large side surfaces, in order to direct light in a desired direction. These reflective materials may cover any portion of the LED to aid in directing emitted light in a desired direction. In other embodiments, any portion of the LED may include light extraction features. These light extraction features may include any feature which improves or modifies light extraction. Some examples may include dimpling, texturing, roughening, polishing, or the use of reflective materials.

Figure 12:
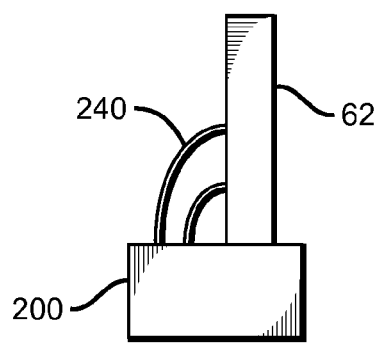
FIG. 12 is a side view of an embodiment of a side mount LED package with wire bonds according to the present invention.

In yet other embodiments, such as LED chips which require wire bonds, current is not applied to the LED 62 or LEDs 62a-d through the mounting surface 300, but can instead be applied from any other surface, such as by a wire bond. As shown in FIG. 12, bond wires 240 may be included on the large side surfaces. These wire bonds may be on one side or connected to multiple sides of the LED 62 or LEDs 62a-d. As with WBF connections, these wire bonds would connect to the metallization layers or traces 104, 106 of the LED 62 or LEDs 62a-d. In other embodiments, interconnects and wire bonds may be used.

As mentioned above, the LEDs 62 or sub-LEDs 62a-b in the embodiment shown can be side mounted or attached to a submount or a board 200, as shown in FIGS. 4a through 10. For mounting or die attach many bonding techniques can be used and in the embodiment shown a metal bond stack 68 is included between the LED 62 or sub-LEDs 62a-d and the submount 200, with one or more layers of the metal bond stack 68 being on the LED 62 or sub-LEDs 62a-d and one or more layers being on the submount 200. When the LED 62 or sub-LEDs 62a-d is mounted to the submount or the board 200, the metal layers from the LED 62 or sub-LEDs 62a-d come in contact with the metal layers from the submount or board 200. Sufficient heat is applied to cause the metal layers to bond together and when the heat is removed the LED 62 or sub-LEDs 62a-d is held by the metal bond stack 68 to the submount or board 200. Metallization 216 and 218 are now in contact with the submount or board 200 providing electrical connection and heat dissipation to the submount or the board. Metal stacks 68 and die attach pads 216 and 218 can be made of multi-layers of different materials such as Ni, Au, Pd and Sn, Ag, Cu or combinations and alloys thereof. It is understood that this bonding can also occur at the LED chip level or at portions of the wafer level. Whether LED 60 is a single junction LED 62 or sub-LEDs 62a-d, this mounting area would function the same since the string of sub-LEDs 62a-d would need same type and number of die attach pads and electrical connections to the submount or the board as shown in FIG. 7.

The LED 60 may be any size. In some embodiments the thickness of LED 62 or sub-LEDs 62a-d, shown in FIG. 5 as distance T, may be less than 500 µm. In other embodiments thickness T may be less than 300 µm. In some other embodiments thickness T may be less than 200 µm. In some embodiments the length of LED 62 or sub-LEDs 62a-d, shown in FIG. 5 as distance L, may be less than 5 mm. In other embodiments distance L may be less than 3 mm. In some other embodiments distance L may be less than 2 mm. Distance T may also be referred to as the minor axis of the LED and distance L the major axis of the LED.

Traditionally, majority of one of the LED's larger surfaces is covered with a reflective mirror. In embodiments according to the present invention, because of the mounting orientation a mirror on the larger LED surface is not necessary since light may be emitted directly from both sides of the LED or sub-LEDs without the use of a reflective surface. A mirror however may be used on the bottom or mounting surface 300 of the LED or sub-LEDs to reflect the small portion of light which is emitted in the downward direction. The mirror is arranged to reflect light emitted from the active region of the LED or sub-LEDs toward the submount or the board so that the light contributes to overall useful emission of the LED or sub-LEDs.

In some embodiments the mirror 112 may include a surrounding portion comprised of a barrier layer, such as a diffusion barrier. This diffusion barrier may comprise metals or insulator materials. A barrier layer is larger than the mirror 112 and completely wraps around or surrounds mirror 112. The barrier prevents the mirror 112 material from migrating into the surrounding materials, causing shorting and other reliability issues of the LED. The barrier may also prevent material diffusing into the mirror material. Mirror 112 can comprise many different materials such as highly reflective metals, like aluminum or dinitride, but preferably would be made of silver for its high reflectivity. Mirror 112 also can comprise reflective structures such as a distributed Bragg reflector (DBR). The barrier may be any metal which can prevent mirror 112 material migration, for example in the case where a mirror is made of silver. In one embodiment, the barrier is comprised of multiple metal layers, for example 3-5 layers, but can comprise more or fewer layers. In one example of a layered barrier, the outside layers of the barrier can be made of a material such as titanium, for good adhesion to surrounding layers, and inner layers of the barrier can be made of heavier metals, such as nickel which is a good diffusion barrier.

As shown in FIGS. 4a through 8, in order to utilize a WBF structure, the top metallization layers 104, 106 are connected to die attach pads. Each LED 60 can have at least first and second contacts or die attach pads and in the embodiments shown. As described below, the sub-LEDs 62a-b can be contacted on their top surface as in conventional horizontal or lateral geometry devices. In embodiments where the substrate 64 is conductive, a contact may be placed on that side of the device. As further described below in other embodiments, the present invention can be used with LEDs having lateral geometry wherein the sub-LEDs can be contacted from one side or surface of the sub-LEDs, instead of both the top and bottom surfaces as is the case for vertical geometry. As described above with reference to FIG. 12, in other embodiments, which are not WBF, metallization layers 104, 106 may include contacts on the other surfaces for wire bonds or interconnects.

The contacts to the p-type and n-type layers of LEDs 62 or sub-LEDs 62a-d can comprise many different materials such as Au, copper (Cu), nickel (Ni), indium (In), aluminum (Al), silver (Ag), or combinations thereof. Other embodiments can comprise conducting oxides and transparent conducting oxides such as indium tin oxide, nickel oxide, zinc oxide, cadmium tin oxide, indium oxide, tin oxide, magnesium oxide, $ZnG_{a2}O_4$, $ZnO_2$/Sb, $G_{a2}O_3$/Sn, $AgInO_2$/Sn, $I_{n2}O_3$/Zn, $CuAlO_2$, $LaCuOS$, $CuGa_{o2}$ and $SrC_{u2}O_2$. The choice of material used can depend on the location of the contacts as well as the desired electrical characteristics such as transparency, junction resistivity and sheet resistance. The choice of the material may also be dependent on the P-type and N-type semiconductors that form the LED.

In operation, electrical connections can be made to first and second die attach pads 216, 218 formed by the metallization layer 114. In embodiments with sub-LEDs 62a-d, the electrical current passes through the first sub-LED 62a to the second sub-LED 62b via interconnect 120. The current passes through the second sub-LED 62b, continuing to the remaining sub-LEDs 62c-d, with all the sub-LEDs emitting light in response to the electrical current applied to the die attach pads. More sub-LEDs may be added between the sub-LEDs 62a-d with the interconnect 120 repeating between each of those conducting the electrical current to the next sub-LEDs.

The electrical contact to the n-type layer 100 is made by the n-die attach pad 216 contacting metallization layers leading to metallization layer for the n-electrode or contact trace 106. The metallization layer for the re-contact trace 106 contacts the n-type layer 100 through the vias 130, 132.

A first electrical connection is made to the metallization layer 114 which serves as a p-die attach pad 218 of the first LED 62 or sub-LED 62a. The current travels through current spreading trace 104, goes through the P-N junction to the n-type layer 100, and then through the vias 130, 132, to the n current contact trace 106 and to the second die attach pad 216. Insulator 110 prevents the current from traveling to other components causing the LED to short. At least a portion of light is then directly emitted from the LED. Another portion may be emitted after being reflected off mirror 112. In embodiments with a string of sub-LEDs 62*a-d*, the current travels through each sub-LEDs in a similar fashion as described above. Metallic interconnects connect sub-LEDs. In some embodiments, each sub-LED has n-contact trace and p-current spreading trace that are not shown in FIG. 7 for simplicity. The current can travel through all the sub-LEDs. Insulator 110 isolates the semiconductor layers from metallizations such as die attach pads 216, 218 and from current spreading traces 104 and 106. Current goes through first sub-LED 62*a*, then goes through interconnect 120 which connects the n-type layer 100 of 62*a* to the p-type semiconductor layer 102, through p-contact material such as transparent conductor 230, of the second sub-LED 62*b*. The current then goes through the P—N junction 100, 102 of the second sub-LED 62*b* and activates this sub-LED 62*b*. The current then travels through the n-die attach pad 216 to where second electrical connection is made. In the case where there are more than 2 sub-LEDs in series, more interconnects are needed to connect all the sub-LEDs. The operation of all the sub-LEDs are similar. More information regarding multi-junction LEDs can be found in U.S. patent application Ser. No. 12/905,995 filed Oct. 15, 2010, entitled "HIGH VOLTAGE WIRE BOND FREE LEDS" and U.S. patent application Ser. No. 12/418,816, filed Apr. 6, 2009, entitled "HIGH VOLTAGE LOW CURRENT SURFACE EMITTING LED", both of which are incorporated herein by reference.

Some embodiments of LEDs 62 and sub-LEDs 62*a-b* can have other features and Group-III nitride based sub-LEDs for example, features to assist in spreading current from the contacts. This is particularly applicable to spreading current into p-type Group-III nitrides and the current spreading structure can comprise thin semitransparent current spreading layer covering some or the entire p-type layer. These layers can comprise different materials including but not limited to a thin layer of metal such as platinum (Pt) or a transparent conductive oxide such as indium tin oxide (ITO).

The submount 200 can be formed of many different materials such as metals, silicon, alumina, aluminum nitride, silicon carbide, sapphire, or a polymeric material such as polyimide and polyester etc. The submount or board is usually made of composite of different materials listed above. In other embodiments the submount or board 200 can include a reflective or highly reflective material, such as reflective ceramics, dielectrics, metal reflectors like silver, or a mixture of silicone and reflective powder such as Aluminum oxide and titanium oxide, to enhance light extraction from the component. In other embodiments the submount 200 can comprise a printed circuit board (PCB), or any other suitable material, such as T-Clad thermal clad insulated substrate material, available from The Bergquist Company of Chanhassen, Minn. For PCB embodiments different PCB types can be used such as standard FR-4 metal core PCB, or any other type of printed circuit board.

As described above, in conventional low voltage and high current single junction LED chips, the LED active layers can be continuous across all or most of substrate 64 such that a single junction LED is provided. An electrical current is applied to the single LED in some embodiments with the help of current spreading structures. In embodiments with sub-LEDs 62*a-d*, the LED chip 60, the single junction LED chip is separated into multiple sub-LEDs 62*a-d* on substrate 64. Many different methods can be used to accomplish this separation and in one embodiment portions of the continuous epitaxy layers can be etched away using known etching techniques to provide electrical separation between the sub-LEDs 62*a-d*. In one embodiment portions of the LED active region and other epitaxy layers are being etched down to the substrate 64 to form the open areas between adjacent LEDs 62*a-d*.

It is understood that the greater the number of sub-LEDs 62*a-d* results in a greater number of openings or interconnects formed between sub-LEDs. With each opening or interconnect a portion of the emitting active area is removed, such that there can be less active area for the LED chip compared to single junction devices covering the same area of a chip. There is typically a corresponding reduction in active emission area with the greater the number of sub-LEDs. This reduction in active emission area can result in a corresponding increase in current density and reduction in light emission from the LED chip. The greater the reduction in the active emission area, the smaller that active area utilization ratio (i.e. ratio of active area for sub-LED device compared to the LED footprint). To minimize this reduction in emission area, the alignment tolerances between sub-LEDs should be as small as possible such that the amount of active area that is removed between sub-LEDs is as small as possible. The alignment tolerances between different layers of a multi-junction LED should be less than 5 microns, with preferred tolerances being less than 2 microns. The active area utilization ratio should be greater than 50%, with suitable embodiments have an active area utilization ratio greater than 75%.

The number and size of the vias leading to the n-type semiconductor layer 100 also impact light emission. The greater the number of vias 130, 132 to n-type semiconductor, and size, the greater the area of light emitting region which is removed. Therefore it is preferred to use multiple smaller vias rather than one long via spanning the entire sub-LED, as shown in FIG. 4*a*. More vias 130, 132 and associated metallization layers 106 help current spreading in the n-type semiconductor.

In the embodiment shown, the sub-LEDs 62*a-d* are connected in series so that a current applied to the first sub-LED 62*a* passes through to the remaining serially connected sub-LEDs 62*b*. To allow for this type of serial connection, the sub-LEDs 62*a-d* are electrically insulated from each other except at interconnect 120. Also, in order to allow the high voltage LED to be wire bond free, die attach pads are placed on the sidewall of the chip. Insulator 110 can be deposited on the LED 62 or the sub-LEDs 62*a-d* using conventional methods and can be deposited prior to mounting on the submount 200. The insulator 110 can be made of many different insulating materials including but not limited to silicon nitride ($Si_xN_y$), aluminum nitride (AlN), silicon dioxide ($SiO_2$), or aluminum oxide ($Al_2O_3$). Polymer materials such as BCB and polyimide can also be used.

The insulating layer 110 can have many different thicknesses, with the thickness being sufficient to withstand at least the voltage applied to the LED 60. For example, for an LED chip embodiment having 50 volts applied to its sub-LEDs can have a $Si_xN_y$ insulating layer thickness of 1,000 to 20,000 angstroms (Å). It is understood, however, that the insulating layer can have many different thicknesses as well. Thicker layers can provide the additional advantage of compensating for small manufacturing defects formed in the insulating layer during deposition. Thicker layers, however, can also reduce the ability of the LED chip to dissipate heat. Accordingly, there is a trade-off between defect tolerance and thermal dissipation when determining the best thickness for a particular LED chip.

Conductive metallization layers 104, 106 make up a portion of the n-contact, p-contact, and associated vias 130, 132. Each of the metallization layers 104, 106 comprises an electrically conductive material or a stack of different metals to spread current to the contacted layers of each of the LEDs 62 or sub-LEDs 62a-d, with suitable materials being any metal such as aluminum, titanium, or gold those listed above for the first and second contacts. It is preferred to include a low resistivity metal in the stack. Metallization trace 106, in some embodiments, contacts a semiconductor material such as GaN and therefore must be comprised of a material which can provide good ohmic contact to such semiconductor materials, like Aluminum. Metallization layer 104, in some embodiments, primarily contacts other metals or transparent metal oxides and should comprise of a material well suited for this type of contact, such as Titanium, TiW, Ni, gold or copper. The metallization layers 104, 106 can be fabricated using known techniques such as sputtering, evaporation, CVD or plating techniques.

Figure 9:
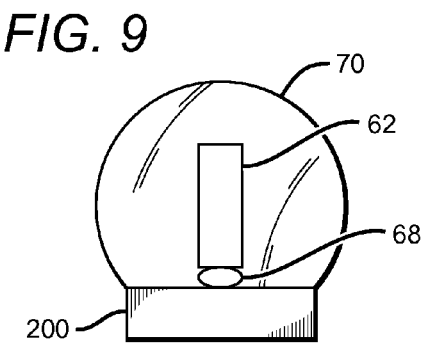
FIG. 9 is a side view of one embodiment of a side mount LED package according to the present invention.

Some or all of the LED 62 or sub-LEDs 62a-d can be coated with one or more phosphors 72 with the phosphors absorbing at least some of the LED light and emitting a different wavelength of light such that the LED emits a combination of light from the LED and the phosphor. In some embodiments this phosphor may have an encapsulation material coating. In other embodiments the phosphor may be mixed in the encapsulant or coated on a surface of the encapsulant. In yet other embodiments there may be no encapsulation. In other embodiments, an encapsulant with or without wavelength conversion materials may be placed over the LED. This encapsulant may be comprised of any suitable material including silicone, epoxy, glass, or a soft encapsulant. These encapsulants may serve as protection for the chip or may also have optical functions. FIG. 9 shows an LED chip 60 with an encapsulant 70 placed over it. Different embodiments according to the present invention comprise LEDs or sub-LEDs that emit blue light that pumps (i.e. is absorbed by) the phosphor. Part of the blue light is then converted to yellow light. The LED 62 or sub-LEDs 62a-d emit a white light which is the result of the combination of blue and yellow light. In one embodiment the phosphor comprises commercially available YAG:Ce, although a full range of broad yellow spectral emission is possible using conversion materials based on the $(Gd,Y)_3(Al,Ga)_5O_{12}$:Ce system, such as the $Y_3Al_5O_{12}$:Ce (YAG). Other yellow phosphors that can be used for white emitting LED chips include: $Tb_{3-x}RE_xO_{12}$:Ce (TAG); RE=Y, Gd, La, Lu; or $Sr_{2-x-y}Ba_xCa_ySiO_4$:Eu.

Figure 11:
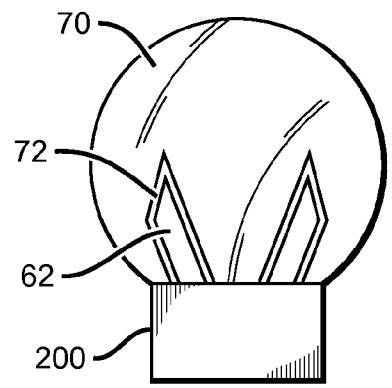
FIG. 11 is a side view of another embodiment of a side mount LED package according to the present invention.

FIG. 11 is a side view of another embodiment of a package with side mount LEDs 62. In this embodiment 2 LED chips 62 are mounted at an angle. Each of the LEDs 62 is coated with a phosphor 72. As stated above other embodiments may have no phosphor, phosphor over the LEDs, phosphor over the encapsulant, or phosphor mixed into the encapsulant. The LEDs 62 are surrounded by an encapsulant 70. In other embodiments any number of LEDs 62 may be mounted.

It is understood that the different LED 62 or sub-LEDs 62a-d can be coated with different types of phosphors to absorb LED light and emit different colors of light. For example, different yellow, green, red phosphors or their mixtures can be used that exhibit excitation any wavelength in between UV and red emission spectrum. Many of these provide a desirable peak emission, have efficient light conversion, and have acceptable Stokes shift.

The LED 62 or sub-LEDs 62a-d can be coated with a phosphor using many different methods, including spray coating, with one suitable being described in U.S. patent application Ser. Nos. 11/656,759 and 11/899,790, both entitled "Wafer Level Phosphor Coating Method and Devices Fabricated Utilizing Method", and both of which are incorporated herein by reference. Alternatively the LEDs can be coated using other methods such as electrophoretic deposition (EPD), with a suitable EPD method described in U.S. patent application Ser. No. 11/473,089 entitled "SYSTEM FOR AND METHOD FOR CLOSED LOOP ELECTROPHORETIC DEPOSITION OF PHOSPHOR MATERIALS ON SEMICONDUCTOR DEVICES", which is also incorporated herein by reference. It is understood that LED packages according to the present invention can also have multiple LEDs of different colors, one or more of which may be white emitting.

These LEDs 60 may be packaged separately or multiple LEDs 60 may be placed in one package. The LED 60 packages can comprise one or more LEDs 62 or sub-LEDs 62a-d encapsulated with a material, as shown in FIG. 9, or unencapsulated LEDs. The packages may include adjacent or remote conversion materials or diffusers. These features are described in U.S. patent application Ser. No. 13/029,063 to Hussell et al., entitled "HIGH EFFICACY LED LAMP WITH REMOTE PHOSPHOR AND DIFFUSER CONFIGURATION," assigned to Cree, Inc. and U.S. patent application Ser. No. 11/895,573 to Chakraborty, entitled "LIGHT EMITTING DEVICE PACKAGES USING LIGHT SCATTERING PARTICLES OF DIFFERENT SIZE," assigned to Cree, Inc. both of which are incorporated herein by reference.

It may be desirable to modify (e.g., texture or roughen) various surfaces on or within the device to provide a multitude of angled surfaces and increase light extraction. Surfaces which may be modified include the n-type layer 100, p-type layer 102 or substrate 64. The growth substrate 64 can be shaped before epitaxy layers are grown (as shown in FIG. 6) or it can be shaped at a later stage of LED fabrication. A modified surface improves light extraction by providing a varying surface that allows light that would otherwise be trapped in the LED, by total internal reflection (TIR), to escape as emitted light. The variations in the modified surface increase the chances that the light will reach an emission surface within the critical angle (as defined by Snell's law) and will be emitted. For light that does not escape through the modified surface, the variations of the modified surface reflect the light at different angles, increasing the chances that the light will escape on the next pass.

There are several known methods by which a semiconductor surface may be modified. The surface may have portions removed by processes such as etching, grinding or ablation. It is also possible to add material, such as nanoparticles or light extraction elements for example, to the surface in order to give it a non-uniform texture. Adding light extraction structures to a surface within the device is discussed at length in U.S. Pat. No. 6,657,236 assigned to Cree, Inc. and incorporated herein by reference. Another surface modification method is to damage the surface by subjecting it to high temperatures or grinding. A combination of any of these processes may also achieve the desired surface modifications.

Some or all of the LED 62 or sub-LEDs 62a-d may further include a modified or roughened light emission surfaces. The roughened surfaces may be included in all or a portion of the surface area of a layer of the base LED structure or in all or a portion of the surface areas of an additional layer of material applied to the base LED structure. These surfaces may be roughened as described in U.S. patent application Ser. No. 11/042,030, which has been incorporated entirely herein by reference. In one embodiment, substrate 64 may be the surface which is at least in part roughened, as shown in FIG. 6. In other embodiments, for example, if substrate is removed in an n-side up LED structure having a sufficiently thick n-type layer of material, it may be preferable to roughen the n-type layer. In a p-side up base LED structure having a relatively thin layer of p-type material, it may be preferable to add a layer of transparent material, preferably with an appropriate refractive index, to the p-type layer and roughen that layer. A layer of transparent material may also be added to the n-type layer of an n-side up LED structure. In either case, a roughened surface may provide better light extraction. The roughened surface improves light extraction by providing a varying surface that allows light that would otherwise be trapped in the LED by total internal reflection to escape and contribute to light emission.

It is understood that the different LED 62 or sub-LEDs 62a-d can be roughened with different types of roughening techniques and features. For example, the roughened surface may be achieved by etching, using any one of several methods known in the art, such as chemical etching, photoelectrochemical (PEC) etching, and reactive ion etching. Roughening can also be achieved by diamond blade or laser cutting at varies angles with respect to the surface of the LED. In addition, the LED may include side roughened-surfaces as well. Other suitable methods for surface roughening include those described in U.S. patent application Ser. No. 11/082,470.

Although the modified surface is shown as a surface of the substrate 64 in FIG. 6, it is understood that many different surfaces within the device 60 may be modified to achieve similar extraction enhancing effects. The n-type and p-type layer surfaces may be modified. One, both, all (including the side walls) or none of the surfaces of the substrate 64 may be roughened. Also, device 60 might not have any modified surfaces.

The present invention can be used in many different lighting applications, and in particular those using a small sized high output light source. Some of these include, but are not limited to, street lights, architectural lights, home and office lighting, display lighting and backlighting.

Although the present invention has been described in detail with reference to certain preferred configurations thereof, other versions are possible. Therefore, the spirit and scope of the invention should not be limited to the versions described above.

I claim:

1. A light emitting device, comprising:
   at least one light emitter comprising an active region which emits light; and
   a submount arranged such that said at least one light emitter is mounted to said submount such that said active region is angled in relation to said submount, wherein a mounting surface of said light emitter is angled in relation to a plane of said active region.

2. The light emitting device of claim 1, wherein said light emitter is comprised of a LED.

3. The light emitting device of claim 2 further wherein said LED comprises an at least an n-type semiconductor layer, a p-type semiconductor layer, and a substrate, such that said active region is formed at the interface of said n-type semiconductor layer and said p-type semiconductor layer.

4. The light emitting device of claim 1 wherein the primary emission surfaces of said light emitter are parallel to said active region.

5. The light emitting device of claim 3, wherein at least a portion of said substrate is patterned.

6. The light emitting device of claim 1, wherein at least a portion of said light emitter comprises light extraction features.

7. The light emitting device of claim 6, wherein said light extraction features comprise texturing.

8. The light emitting device of claim 6, wherein said light extraction features comprise shaping.

9. The light emitting device of claim 1, wherein a surface of said light emitter which is adjacent to said submount has a surface area equal to or smaller than the surface area of each of the remaining surfaces of said light emitter.

10. The light emitting device of claim 1, wherein a surface of said light emitter which is adjacent to said submount is angled such that it does not form a right angle in relation to at least one of the adjacent surfaces of said light emitter.

11. The light emitting device of claim 4, wherein a surface of said light emitter which is adjacent to said submount has a smaller surface area than each of said primary emission surfaces.

12. The light emitting device of claim 1, wherein said light emitter is mounted to said submount wire bond free.

13. The light emitting device of claim 1, wherein at least a portion of said submount is reflective.

14. The light emitting device of claim 1, wherein a surface of said light emitter which is adjacent to said submount at least in part comprises a reflective material arranged such that it reflects light emitted from said light emitter.

15. The light emitting device of claim 3, wherein at least a portion of said substrate is transparent.

16. The light emitting device of claim 3, wherein at least a portion of said substrate is comprised of an electrically conductive material.

17. The light emitting device of claim 3, wherein said substrate is a growth substrate.

18. The light emitting device of claim 1 further comprising a phosphor layer disposed on at least the light emission surfaces of said light emitter.

19. The light emitting device of claim 3, wherein the primary emission surface is a surface of said LED closest to said substrate.

20. The light emitting device of claim 3, wherein the primary emission surface is a surface of said LED closest to said n-type semiconductor layer.

21. The light emitting device of claim 3, wherein the primary emission surface is a surface of said LED closest to said p-type semiconductor layer.

22. The light emitting device of claim 1, emitting a white light from said light emitting device.

23. The light emitting device of claim 1, emitting down converted light from said light emitter.

24. The light emitting device of claim 3, wherein said n-type semiconductor layer, p-type semiconductor layer, and said active region comprise materials from the Group-III Nitrides.

25. The light emitting device of claim 2, wherein said at least one LED is comprised of a plurality of interconnected sub-LEDs.

26. The light emitting device of claim 25, wherein said interconnected sub-LEDs are serially connected.

27. The light emitting device of claim 25, wherein said interconnected sub-LEDs are connected in parallel.

28. The light emitting device of claim 1 further comprising an encapsulant.

29. The light emitting device of claim 28, wherein said encapsulant comprises a phosphor region.

30. The light emitting device of claim 28, wherein said encapsulant comprises light scattering particles.

31. The light emitting device of claim 1, wherein said light emitter emits light in a Lambertian pattern.

32. The light emitting device of claim 3, wherein said n-type and p-type semiconductor layers are comprised of Group III nitride material.

33. The light emitting device of claim 6, wherein said light extraction features comprise reflective material.

34. The light emitting device of claim 1, wherein said light emitter is electrically connected via wire bonds.

35. The light emitting device of claim 34, wherein said wire bonds are connected to a side surface of said light emitter.

36. The light emitting device of claim 1, wherein said submount is comprised of a thermally conductive material.

37. A LED package, comprising:
a LED comprising a first semiconductor material, a second semiconductor material, a substrate, and an active region formed in between said first and second semiconductor materials;
a submount, wherein said LED is mounted on said submount such that the mounting surface of said LED has a surface area equal to or smaller than any one of the remaining surfaces of said LED; and
an encapsulant disposed over said LED.

38. The LED package of claim 37, wherein the primary emission surfaces of said LED are parallel to said active region.

39. The LED package of claim 38, wherein said primary emission surfaces of said LED are angled in relation to said submount.

40. The LED package of claim 37, wherein at least a portion of said LED comprises light extraction features.

41. The LED package of claim 40, wherein said light extraction features comprise texturing.

42. The LED package of claim 40, wherein said light extraction features comprise shaping.

43. The LED package of claim 37, wherein said mounting surface is angled such that it does not form a right angle in relation to at least one of the adjacent surfaces of said light emitter.

44. The LED package of claim 38, wherein said mounting surface has a smaller surface area than each of said primary emission surfaces.

45. The LED package of claim 37, wherein said LED is mounted to said submount without wire bonds.

46. The LED package of claim 37, wherein at least a portion of said submount is reflective.

47. The LED package of claim 37, wherein said LED is electrically connected by wire bonds.

48. The LED package of claim 37, wherein said mounting surface at least in part comprises a reflective material arranged such that it reflects light emitted from said light emitter.

49. The LED package of claim 37, wherein said substrate is transparent.

50. The LED package of claim 37, wherein said substrate is comprised of an electrically conductive material.

51. The LED package of claim 37, wherein said substrate is comprised of a thermally conductive material.

52. The LED package of claim 37, wherein said substrate is a growth substrate.

53. The LED package of claim 37, further comprising a phosphor layer disposed on at least the light emission surfaces of said LED.

54. The LED package of claim 37, wherein a primary emission surface is a substrate.

55. The LED package of claim 37, wherein a primary emission surface is on the side of said first semiconductor layer.

56. The LED package of claim 37, wherein a primary emission surface is on the side of said second semiconductor layer.

57. The LED package of claim 37, wherein said LED is comprised of a plurality of interconnected sub-LEDs.

58. The LED package of claim 57, wherein said interconnected sub-LEDs are serially connected.

59. The LED package of claim 57, wherein said interconnected sub-LEDs are connected in parallel.

60. The LED package of claim 37, wherein said encapsulant further comprises a phosphor region.

61. The LED package of claim 37, wherein said encapsulant further comprises light scattering particles.

62. The LED package of claim 37, wherein said LED emits light in a Lambertian pattern.

63. The LED package of claim 37, wherein said first and second semiconductor materials are comprised of a Group III Nitride material.

64. A LED package, comprising:
a LED;
a submount, wherein said LED is mounted on said submount such that the mounting surface of said LED is along the minor axis of said LED; and
an encapsulant over said LED.

65. The LED package of claim 64, wherein the primary emission surfaces of said LED are parallel to a major axis of said LED.

66. The LED package of claim 65, wherein said primary emission surfaces of said LED are angled in relation to said submount.

67. The LED package of claim 64, wherein at least a portion of said LED comprises light extraction features.

68. The LED package of claim 67, wherein said light extraction features comprise texturing.

69. The LED package of claim 67, wherein said light extraction features comprise shaping.

70. The LED package of claim 64, wherein said mounting surface is angled such that it does not form a right angle in relation to at least one of the adjacent surfaces of said light emitter.

71. The LED package of claim 65, wherein said mounting surface has a smaller surface area than each of said primary emission surfaces.

72. The LED package of claim 64, wherein said LED is mounted to said submount without wire bonds.

73. The LED package of claim 64, wherein at least a portion of said submount is reflective.

74. The LED package of claim 64, wherein said LED is electrically connected by wire bonds.

75. The LED package of claim 64, wherein said mounting surface at least in part comprises a reflective material arranged such that it reflects light emitted from said light emitter.

76. The LED package of claim 64, wherein said substrate is transparent.

77. The LED package of claim 64, wherein said substrate is comprised of an electrically conductive material.

78. The LED package of claim 64, wherein said substrate is comprised of a thermally conductive material.

79. The LED package of claim 64, wherein said substrate is a growth substrate.

80. The LED package of claim 64, further comprising a phosphor layer disposed on at least a portion of the light emission surfaces of said LED.

81. The LED package of claim 64, wherein a primary emission surface is a substrate.

82. The LED package of claim 64, wherein a primary emission surface is on the side of said first semiconductor layer.

83. The LED package of claim 64, wherein a primary emission surface is on the side of said second semiconductor layer.

84. The LED package of claim 64, wherein said LED is comprised of a plurality of interconnected sub-LEDs.

85. The LED package of claim 64, wherein said encapsulant further comprises a wavelength conversion material.

86. The LED package of claim 64, wherein said encapsulant further comprises light scattering particles.

87. The LED package of claim 64, wherein said first and second semiconductor materials are comprised of a Group III Nitride material.

* * * * *